(12) United States Patent
Kuo

(10) Patent No.: US 6,329,283 B1
(45) Date of Patent: Dec. 11, 2001

(54) METHOD OF FABRICATING SELF-ALIGN-CONTACT

(75) Inventor: Chien-Li Kuo, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/522,868

(22) Filed: Mar. 9, 2000

Related U.S. Application Data

(62) Division of application No. 09/095,401, filed on Jun. 10, 1998, now Pat. No. 6,169,025.

(30) Foreign Application Priority Data

Mar. 4, 1997 (TW) .......................................... 87103110 A

(51) Int. Cl.[7] .............................................. H01L 21/4763
(52) U.S. Cl. ..................... 438/630; 438/621; 438/622; 438/647; 438/649; 438/655; 438/656; 438/657; 438/660; 438/664; 438/680; 438/681; 438/682; 438/683; 438/684; 438/685
(58) Field of Search ................... 438/621, 622, 438/630, 647, 649, 655, 657, 664, 660, 680–685

(56) References Cited

U.S. PATENT DOCUMENTS

| | | | |
|---|---|---|---|
| 4,378,628 | * | 4/1983 | Levinstein et al. ............... 29/571 |
| 5,094,981 | * | 3/1992 | Chung et al. ..................... 437/190 |
| 5,480,837 | * | 1/1996 | Liaw et al. ....................... 437/193 |

* cited by examiner

*Primary Examiner*—John F. Niebling
*Assistant Examiner*—David A Zarneke

(57) ABSTRACT

A method of fabricating a self-align-contact is provided. A first gate and a second gate are formed on a semiconductor substrate. A spacer is formed on the sidewalls of the first gate and the second gate, and a source/drain region is formed between the first gate and the second gate. A dielectric layer is formed on the first gate, the second gate, the source/drain region, the spacer, and the semiconductor substrate. A self-align-contact opening is formed in the dielectric layer to expose the source/drain region. A metal silicide layer is formed on the source/drain region. A first conductive layer, such as doped polysilicon, is formed on the metal silicide layer and in the self-align-contact opening. A second conductive layer is formed on the first conductive layer, and the first conductive layer and the second conductive layer are patterned.

20 Claims, 4 Drawing Sheets

METHOD OF FABRICATING SELF-ALIGN-CONTACT

CROSS-REFERENCE TO RELATED APPLICATION

This application is a divisional application of, and claims the priority benefit of, U.S. application Ser. No. 09/095,401 filed on Jun. 10, 1998 now U.S. Pat. No. 6,169,025 which claims the priority benefit of Taiwan application serial no. 87103110, filed Mar. 4, 1998.

BACKGROUND OF THE INVENTION

1. Field of the Invention

The invention relates in general to the method of fabricating a semiconductor device, and more particularly to the method of fabricating a self-align-contact by using self-align silicide (Salicide) process.

2. Description of the Related Art

In the semiconductor process there are many methods of fabricating a self-align-contact. One of the conventional methods of forming a self-align-contact includes first providing a substrate on which there are at least two MOS devices and then forming an insulating layer, such as silicon oxide, on the substrate. Each of the two MOS devices includes a polysilicon gate and spacers on the sidewalls of the gate. The two MOS devices have a common source/drain region located between the gates of the two MOS devices. The insulating layer is patterned to form a self-align-contact opening which exposes the common source/drain region. A conductive layer is deposited in the self-align-contact opening to form a contact.

A process flow showing the formation of a conventional self-align-contact is illustrated by FIGS. 1A–1E. Referring to FIG. 1A, a gate 102 and source/drain regions 110 are formed on a semiconductor substrate 100. The gate 102 includes a gate oxide 104, a doped polysilicon layer 106 and a cap layer 108. The cap layer 108 is formed over the doped polysilicon layer 106 to protect the doped polysilicon layer 106. A spacer 112 is formed on the sidewalls of the gate 102. The source/drain regions 110 are lightly doped drain (LDD) structures. The method of forming the source/drain regions 110 includes lightly implanting ions into the semiconductor substrate 100 using the gate 102 as a mask and heavily implanting ions into the semiconductor substrate 100 using the spacer 112 as a mask. Referring to FIG. 1B, a dielectric layer 114 is formed on the semiconductor substrate 100 by CVD.

Next, referring to FIG. 1C, the dielectric layer 114 is patterned by both a lithography process and etching to form a contact opening 116 between two gates 102 to expose the source/drain region 110.

Next, referring to FIG. 1D, a conductive layer 120, such as doped polysilicon, is formed in the contact opening 116 and on the semiconductor substrate 100 by deposition.

Referring to FIG. 1E, a conductive layer 122, such as metal silicide, is deposited on the conductive layer 120 to reduce the resistance of the conductive layer 120. Then the conductive layer 120 and the conductive layer 122 are patterned by both a lithography process and etching to form a self-align-contact of prior art.

In the integrated circuits (IC) process, the conventional method of fabricating a self-align-contact includes many drawbacks. For example, the resistance of the self-align-contact is very large and such high resistance can not meet the needs of current integrated circuits with high operation speed.

SUMMARY OF THE INVENTION

It is an object of the invention to provide a method of fabricating a self-align-contact by using a salicide process.

It is another object of the invention to provide a simple method of fabricating a self-align-contact with low resistance and that is able to make good ohmic contact.

It is an object of the invention to provide a method of fabricating a self-align-contact to meet the needs of current integrated circuits with high operation speed.

A method of fabricating a self-align-contact is provided. A first gate and a second gate are formed on a semiconductor substrate. Spacers are formed on the sidewalls of the first gate and the second gate, and a source/drain region is formed between the first gate and the second gate. A dielectric layer is formed on the first gate, the second gate, the source/drain region, the spacers, and the semiconductor substrate. A self-align-contact opening is formed in the dielectric layer to expose the source/drain region. A metal silicide layer is formed on the surface of the source/drain region. A first conductive layer, such as doped polysilicon, is formed on the metal silicide layer and in the self-align-contact opening. A second conductive layer is formed on the first conductive layer, and the first conductive layer and the second conductive layer are patterned.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

The method of the invention is to form a self-align-contact with low resistance and an ability to make good ohmic contact by using a salicide process.

Figure 1A:
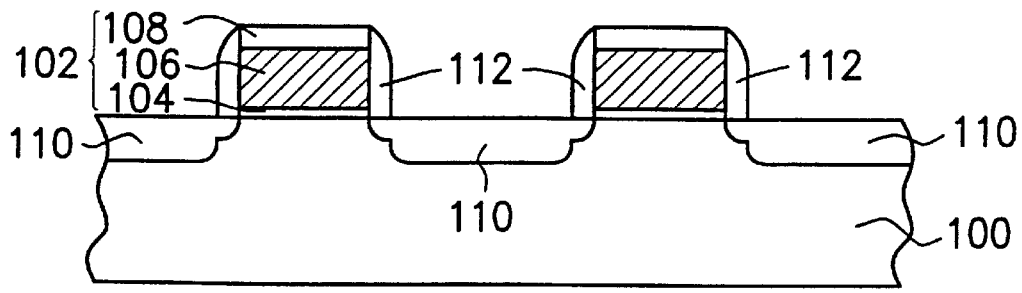
FIGS. 1A to 1E are cross-sectional views showing a conventional process flow of fabricating a self-align-contact.
Figure 1B:
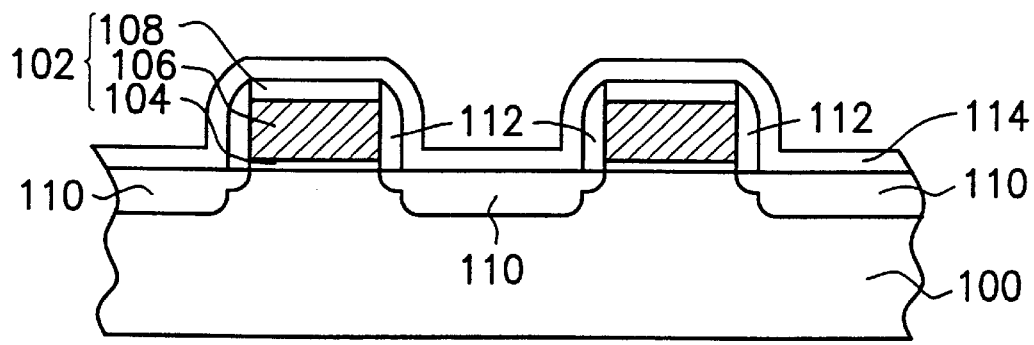
Figure 1C:
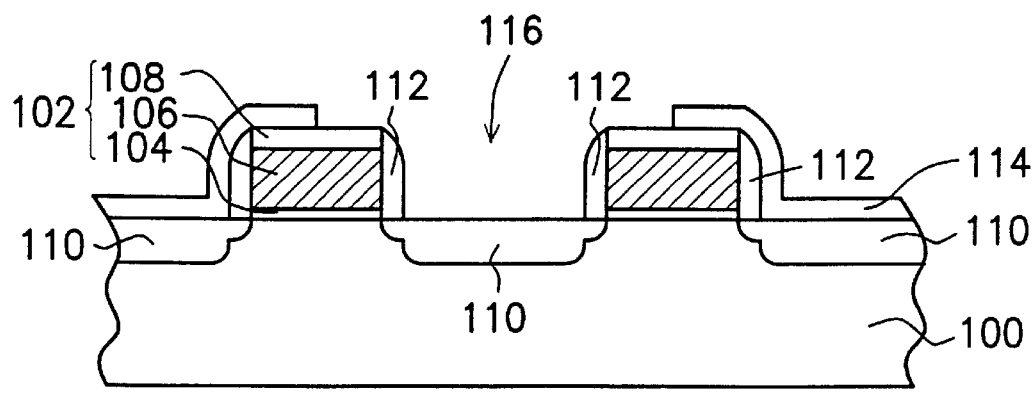
Figure 1D:
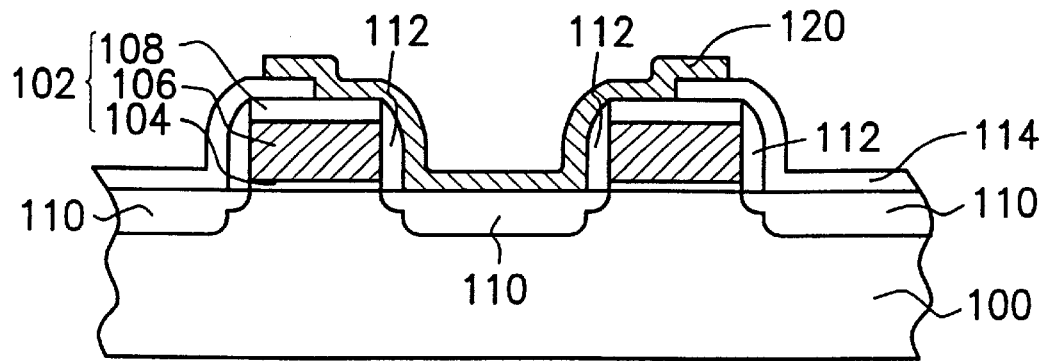
Figure 1E:
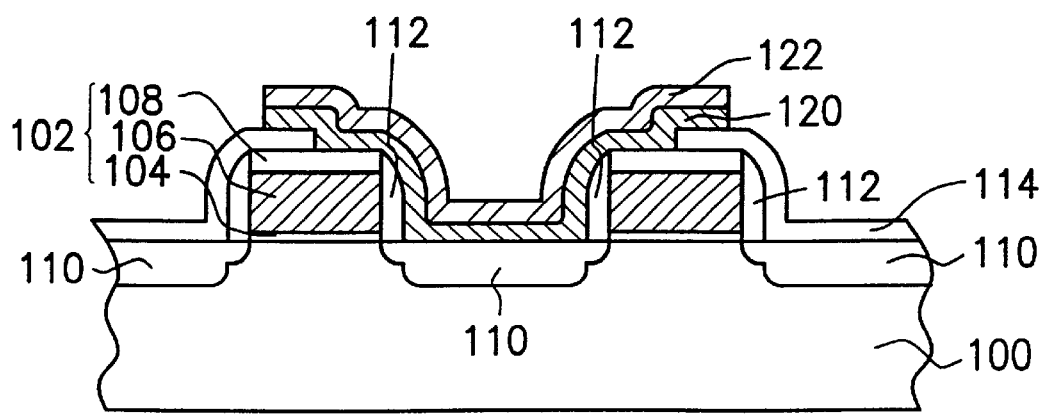
Figure 2A:
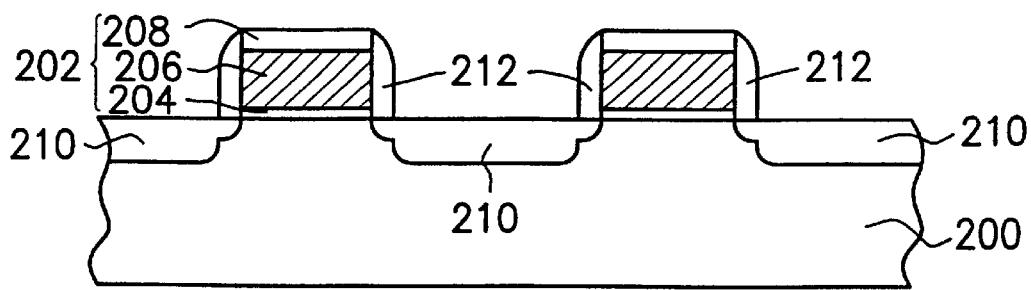
FIGS. 2A to 2F are cross-sectional views showing a process flow of fabricating a self-align-contact of the invention.

FIGS. 2A to 2E are cross-sectional views showing a process flow of fabricating a self-align-contact of the invention. Referring to FIG. 2A, a gate 202 and source/drain regions 210 are formed on a semiconductor substrate 200. The semiconductor substrate 200 is lightly doped P-type semiconductor substrate or a lightly doped P-type well. The gate 202 includes a gate oxide 204, a conductive doped polysilicon layer 206 and a cap layer 208. The method of forming the gate oxide 204 includes oxidizing the semiconductor substrate 200 at a temperature of 800–1000° C. The gate oxide 204 is oxide and is 30–200 Å thick. The conductive layer 206 includes a doped polysilicon layer and a metal suicide layer. The doped polysilicon layer is formed to have a thickness of 1000–3000 Å by low-pressure chemical vapor deposition (LPCVD). The doped polysilicon layer is formed by depositing a polysilicon layer, implanting phosphorus or arsenic ions to the polysilicon layer and annealing the polysilicon layer. The implanting step is performed with the depositing step, or performed after the depositing step. The metal silicide layer includes $WSi_2$, $TiSi_2$, and $MoSi_2$. The metal silicide layer is 1000–3000 Å thick. The cap layer 208 is formed on the conductive layer 206 to protect the conductive layer 206. The cap layer 208 includes silicon oxide or silicon nitride formed by chemical vapor deposition (CVD). The cap layer 208 is 1500–2000 Å thick. A spacer 212 is formed on the sidewalls of the gate 202. The spacer 212 is formed by depositing an insulating layer on the semiconductor substrate 200 and etching back the insulating layer.

The source/drain regions 210 are lightly doped drain (LDD) structures. The method of forming the source/drain regions 210 includes lightly implanting ions, such as phosphorus or arsenic ions, into the semiconductor substrate 200 using the gate 202 as a mask and heavily implanting ions into the semiconductor substrate 200 using the spacer 212 as a mask. The preferred energy of the light implantation is 40–80 KeV and the preferred dosage of the light implantation is $5\times10^{12}$–$5\times10^{14}$ ions/cm$^2$. The preferred energy of the light implantation is 50–80 KeV and the preferred dosage of the light implantation is $1\times10^{15}$–$8\times10^{15}$ ions/cm$^2$.

Figure 2B:
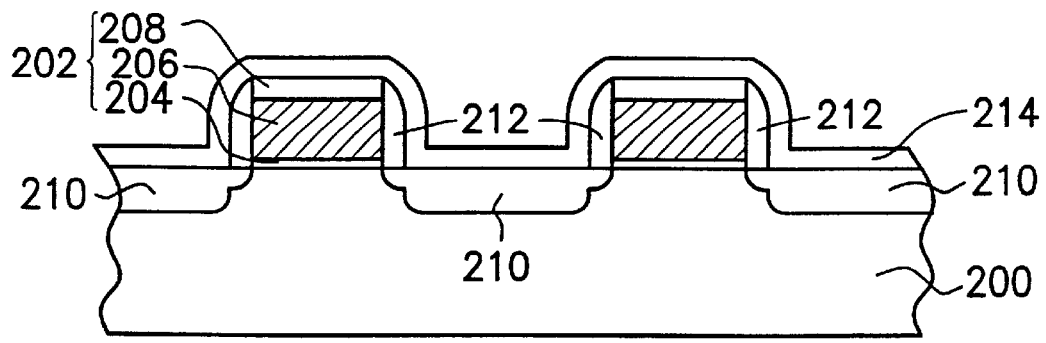

Referring to FIG. 2B, a dielectric layer 214 is formed on the gate 202, the source/drain regions 210 and the spacer 212. The dielectric layer 214 includes silicon oxide or silicon nitride by chemical vapor deposition (CVD). The dielectric layer 214 is 200–300 Å thick.

Figure 2C:
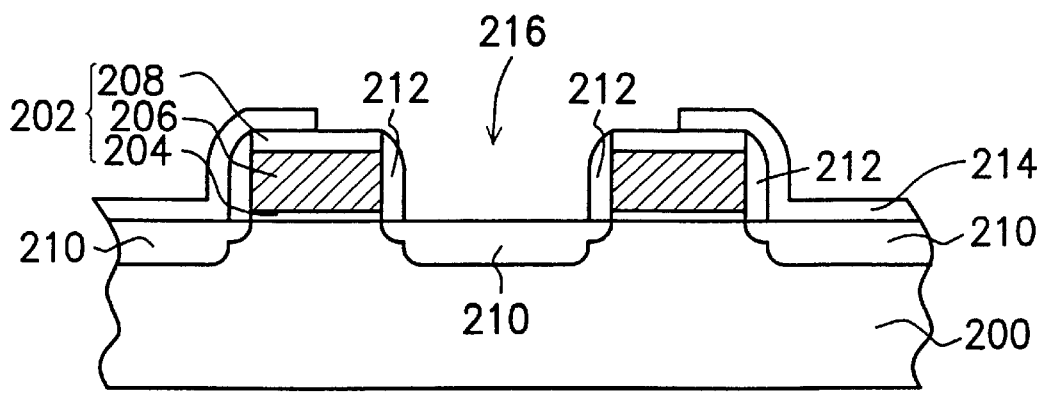

Referring to FIG. 2C, the dielectric layer 214 is patterned by a lithography process and anisotropic etching to form a self-align-contact opening 216 between two gates 202 to expose the source/drain regions 210.

Figure 2D:
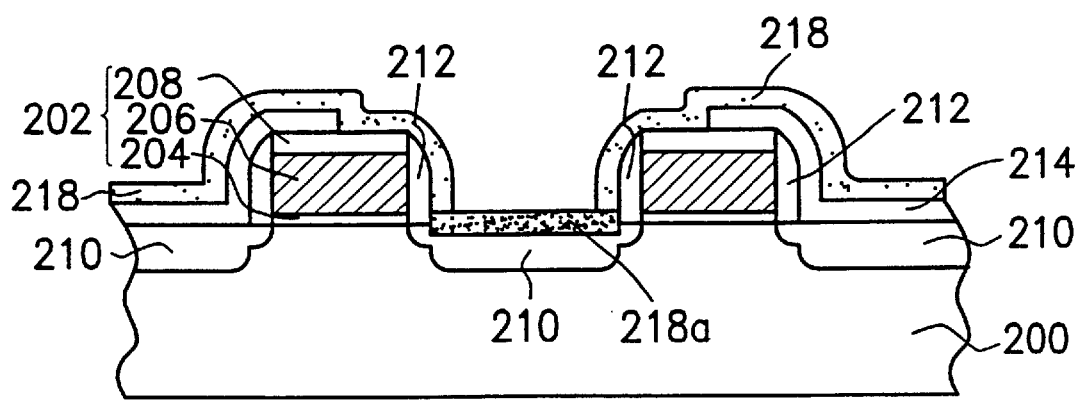

Referring next to FIG. 2D, a self-align-silicide (Salicide) process is performed to form a metal silicide layer on the surface of the source/drain regions 210. First, a metal layer 218 is formed on the gate 202, the source/drain regions 210 and the spacer 212 by sputtering. The metal layer 218 is 200–1000 Å thick and includes Ti, Co, Pt or other metals. Next, an annealing step is performed to make the metal layer 218 react with the silicon on the surface of the semiconductor substrate 200 to form a metal silicide layer 218a. Because there is silicon on the surface of the source/drain regions 210 only, the metal silicide layer 218a is formed on the source/drain regions 210 only. The other metal on the source/drain regions 210 and the spacer 212 doesn't react with oxide or nitride and is removed. The metal silicide layer 218a includes TiSi$_2$, CoSi$_2$, PtSi$_2$ and other metal silicide. The other method of forming the metal silicide layer 218a includes depositing metal silicide on the surface of the source/drain regions 210.

Figure 2E:
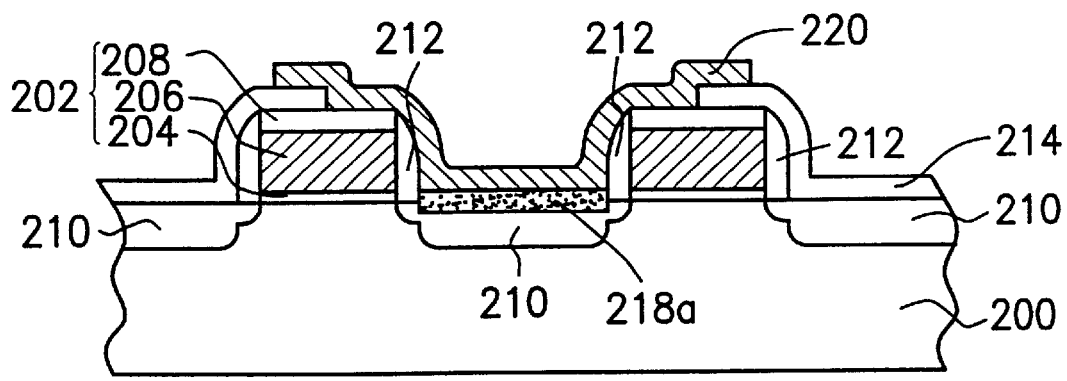

Referring next to FIG. 2E, a conductive layer 220 is deposited on the gate 202, the metal silicide layer 218a and the spacer 212. The conductive layer 220 includes doped polysilicon layer by low-pressure chemical vapor deposition (LPCVD). The conductive layer 220 is formed to a thickness of 1000–3000 Å. The conductive layer 220 is formed by depositing a polysilicon layer, implanting phosphorus or arsenic ions to the polysilicon layer and annealing the polysilicon layer. The implanting step is performed either with or after the depositing step. Then the conductive layer 220 is patterned by a lithography and etching process. The metal silicide layer includes WSi$_2$, TiSi$_2$, and MoSi$_2$.

Figure 2F:
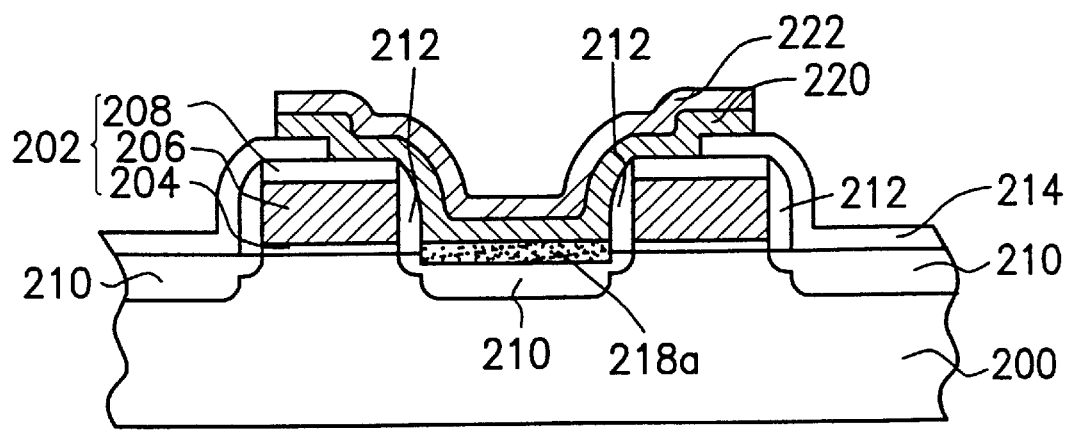

Referring next to FIG. 2F, a conductive layer 222 is formed on the conductive layer 220 by low-pressure chemical vapor deposition (LPCVD). The conductive layer 222 includes metal silicide, such as WSi$_2$, TiSi$_2$, and MoSi$_2$. A self-align-contact of the invention is accomplished.

The self-align-contact of the invention has the following characteristics:

1. The self-align-contact of the invention includes metal silicide layer 218a to increase the ohmic contact between the self-align-contact and the source/drain regions 210 and to reduce the resistance of the self-align-contact. The resistance of the self-align-contact of the invention is smaller than the prior art by an order of one.

2. The self-align-contact of the invention includes metal silicide layer 218a to meet the needs of current integrated circuits with high operation speed.

3. The method of forming the self-align-contact of the invention includes a salicide process that is compatible with general semiconductor process.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A method of fabricating a self-align-contact, comprising the steps of:
   providing a semiconductor substrate with a conductive region;
   forming a dielectric layer on the conductive region and the semiconductor substrate;
   forming a contact opening in the dielectric layer to expose the conductive region, wherein the dielectric layer is completely removed from the surface of the conductive region located between two gates;
   forming a metal silicide layer on the surface of the conductive region;
   forming a first conductive layer on the metal silicide layer and in the contact opening; and
   forming a second conductive layer on the first conductive layer.

2. A method as claimed in claim 1, wherein the conductive region includes a source/drain region.

3. A method as claimed in claim 1, wherein the conductive region includes interconnects.

4. A method as claimed in claim 1, wherein the dielectric layer includes silicon oxide.

5. A method as claimed in claim 1, wherein the dielectric layer includes silicon nitride.

6. A method as claimed in claim 1, wherein the step of forming the dielectric layer includes chemical vapor deposition (CVD).

7. A method as claimed in claim 1, wherein the dielectric layer is 200–300 Å thick.

8. A method as claimed in claim 1, wherein the step of forming the contact opening includes lithography and anisotropic etching process.

9. A method as claimed in claim 1, wherein the step of forming the metal silicide layer includes a salicide process.

10. A method as claimed in claim 9, wherein the salicide process includes sputtering and annealing.

11. A method as claimed in claim 10, wherein the sputtering step forms a metal layer with a thickness of 200–1000 Å.

12. A method as claimed in claim 11, wherein the metal layer is selected from the group consisting of Ti, Co, and Pt.

13. A method as claimed in claim 1, wherein the metal silicide layer includes TiSi$_2$.

14. A method as claimed in claim 1, wherein the metal silicide layer includes $CoSi_2$.

15. A method as claimed in claim 1, wherein the metal silicide layer includes $PtSi_2$.

16. A method as claimed in claim 1, wherein the first conductive layer includes doped polysilicon.

17. A method as claimed in claim 1, wherein the second conductive layer includes metal silicide.

18. A method as claimed in claim 1, wherein the second conductive layer includes $WSi_2$.

19. A method as claimed in claim 1, wherein the second conductive layer includes $MoSi_2$.

20. A method as claimed in claim 1, wherein the second conductive layer includes $TiSi_2$.

* * * * *